(12) United States Patent
Choe

(10) Patent No.: US 7,167,117 B2
(45) Date of Patent: Jan. 23, 2007

(54) TEST CIRCUIT FOR DIGITAL TO ANALOG CONVERTER IN LIQUID CRYSTAL DISPLAY DRIVER

(75) Inventor: Seong-Min Choe, Chungcheongbuk-do (KR)

(73) Assignee: Magnachip Semiconductor, Inc. (KR)

( * ) Notice: Subject to any disclaimer, the term of this patent is extended or adjusted under 35 U.S.C. 154(b) by 0 days.

(21) Appl. No.: 11/198,597

(22) Filed: Aug. 4, 2005

(65) Prior Publication Data

US 2006/0055572 A1    Mar. 16, 2006

(30) Foreign Application Priority Data

Aug. 5, 2004    (KR)    ...................... 10-2004-0061573

(51) Int. Cl.
    *H03M 1/10*      (2006.01)

(52) U.S. Cl. ........................ 341/120; 341/144; 345/87; 345/89

(58) Field of Classification Search ................ 341/118, 341/120, 144, 145, 155, 110; 345/89, 100, 345/103, 212, 590, 87, 83
See application file for complete search history.

(56) References Cited

U.S. PATENT DOCUMENTS

| | | | |
|---|---|---|---|
| 6,593,934 B1 * | 7/2003 | Liaw et al. ................ | 345/590 |
| 6,680,733 B2 * | 1/2004 | Woo et al. ................ | 345/212 |
| 6,781,535 B2 * | 8/2004 | Lee ............................ | 341/144 |
| 6,798,368 B2 * | 9/2004 | Jung et al. ................ | 341/144 |
| 6,950,045 B2 * | 9/2005 | Kim .......................... | 341/118 |
| 6,963,328 B2 * | 11/2005 | Kang et al. ................ | 345/100 |
| 7,006,065 B1 * | 2/2006 | Sugawara et al. ............ | 345/89 |
| 7,006,072 B2 * | 2/2006 | Ahn .......................... | 345/103 |
| 2002/0126077 A1 * | 9/2002 | Baek, II ..................... | 345/87 |
| 2003/0085859 A1 * | 5/2003 | Lee ............................ | 345/87 |
| 2004/0036705 A1 * | 2/2004 | Jung et al. ................ | 345/690 |
| 2004/0160402 A1 * | 8/2004 | Kim et al. .................. | 345/89 |
| 2006/0145972 A1 * | 7/2006 | Zhang et al. ................ | 345/83 |
| 2006/0181494 A1 * | 8/2006 | Morita ........................ | 345/89 |

FOREIGN PATENT DOCUMENTS

| | | |
|---|---|---|
| JP | 08-186492 | 7/1996 |
| JP | 11-168380 | 6/1999 |

\* cited by examiner

*Primary Examiner*—Linh V. Nguyen
(74) *Attorney, Agent, or Firm*—Blakely Sokoloff Taylor & Zafman

(57) ABSTRACT

A test device for testing a digital to analog converter includes a gamma reference unit for generating a plurality of analog signals different from each other; a temporary storing unit for generating a plurality of digital signals different from each other; a decoder for selecting one of the plurality of analog signals or one of the plurality of digital signals in response to a digital code signal; and a switching unit for controlling a connection between the decoder and the gamma reference unit and between the decoder and the temporary storing unit according to an operation mode.

8 Claims, 5 Drawing Sheets

TEST CIRCUIT FOR DIGITAL TO ANALOG CONVERTER IN LIQUID CRYSTAL DISPLAY DRIVER

FIELD OF INVENTION

The present invention relates to a liquid crystal display (LCD) driver integrated chip (IC) for operating an LCD panel; and, more particularly, to a test circuit for testing a digital to analog converter (DAC) included in the LCD driver IC (LDI).

DESCRIPTION OF PRIOR ART

Generally, a liquid crystal display driver integrated chip (LDI) is included in an LCD panel for operating the LCD panel. Herein, the LDI includes a digital to analog converter (DAC) for converting a digital signal to an analog signal.

FIG. 1 is a block diagram showing a conventional thin film transistor LCD (TFT-LCD).

As shown, the conventional TFT-LCD includes a timing control unit 100; a plurality of gate drivers, e.g., 200; a plurality of source drivers, e.g., 300; and a TFT-LCD panel 400.

The plurality of gate drivers are controlled by the timing control unit 100 in order to sequentially drive gate lines of the TFT-LCD panel 400. Similarly, the plurality of source drivers are controlled by the timing control unit 100 to thereby drive source lines of the TFT-LCD panel 400 so that the TFT-LCD panel 400 display image data.

The TFT-LCD panel 400 includes a plurality of unit pixels arranged in a matrix form. Each of the unit pixels includes a thin film transistor T1 and a capacitor C1. A source of the thin film transistor T1 is connected to a source line operated by the source driver 300 and a gate of the thin film transistor T1 is connected to a gate line operated by the gate driver 200.

The gate driver 200 drives a gate line coupled to the gate driver 200 in response to a control signal outputted from the timing control unit 100. The source driver 300 receives data outputted from the timing control unit 100 to thereby generate an analog signal and input the generated analog signal to a source line. In this manner, the TFT-LCD panel 400 displays image data.

FIG. 2 is a block diagram depicting the source driver 300.

As shown, the source driver 300 includes a digital control unit 310; a register unit 320 for storing a digital data signal outputted from the digital control unit 310; a level shifter unit 330 for controlling a level of a signal outputted from the register unit 320; a digital to analog converter 340 for converting a digital signal outputted from the level shifter unit 330 to an analog signal; a analog bias unit 350; and a buffering unit 360 for buffering an output of the digital to analog converter 340 according to a bias generated by the analog bias unit 350 to thereby input the buffered signal to the source line.

The digital control unit 310 receives a source driver start pulse (SSP), a data clock and a digital data from the timing control unit 100 to thereby generate the digital data signal and control the register unit 320.

Each digital data signal is stored in a sampling register by a shift register. The digital data signal stored in the sampling register is transferred to the digital to analog converter 340 through a holding register and a level shifter in response to a control signal LOAD outputted from the timing control unit 100.

Herein, the register unit 320 is operated at a low voltage, e.g., 3.3V; however, the digital to analog converter 340 and the buffering unit 360 are operated at a high voltage, e.g., 6 to 12V. Therefore, the level shifter unit 330 controls a level of a signal outputted from the register unit 320.

The digital to analog converter 340 includes a gamma reference unit 342 for making an input voltage nonlinear to thereby linearly display brightness of light; and a decoding unit 344 for selecting one of a plurality of gamma reference output signals outputted from the gamma reference unit 342 according to the digital signal outputted from the level shifter unit 330 to thereby output the selected signal as an analog signal.

FIGS. 3 and 4 are schematic circuit diagrams respectively showing the gamma reference unit 342 and the decoding unit 344 corresponded to a single channel.

As shown, the gamma reference unit 342 includes a plurality of resistors for generating the plurality of gamma reference output signals according to a gamma reference input. The decoding unit 344 selects one of the plurality of gamma reference output signals in response to the digital signal outputted from the level shifter unit 330 to thereby transfer the selected signal to the buffering unit 360.

Meanwhile, during manufacturing an LDI for performing above-mentioned operations, a decoder included in the LDI is tested. According to the prior art, the decoder is tested by inputting all kinds of digital code signals into the decoder and measuring an analog signal outputted from the decoder.

However, the number of channels for measuring an analog signal is less than the number of channels for measuring a digital signal in a test equipment since a structure of the analog signal measuring channel is more complex than that of the digital signal measuring channel.

Therefore, according to the prior art, in order to complete testing hundreds of analog signals of the LDI, a process of measuring the analog signals by connecting the analog signal measuring channels to output terminals of the decoder should be repeated several times, According to the prior art, a test cost is increased and more time is required for the test.

SUMMARY OF INVENTION

It is, therefore, an object of the present invention to provide a test device for testing a digital to analog converter included in a liquid crystal display driver integrated circuit (LDI) by using a digital logic measuring method.

In accordance with an aspect of the present invention, there is provided a test device for testing a digital to analog converter including a gamma reference unit for generating a plurality of analog signals different from each other; a temporary storing unit for generating a plurality of digital signals different from each other; a decoder for selecting one of the plurality of analog signals or one of the plurality of digital signals in response to a digital code signal; and a switching unit for controlling a connection between the decoder and the gamma reference unit and between the decoder and the temporary storing unit according to an operation mode.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a test device for testing a digital to analog converter included in a liquid crystal display driver integrated chip (LDI) in accordance with the present invention will be described in detail referring to the accompanying drawings.

Figure 1:
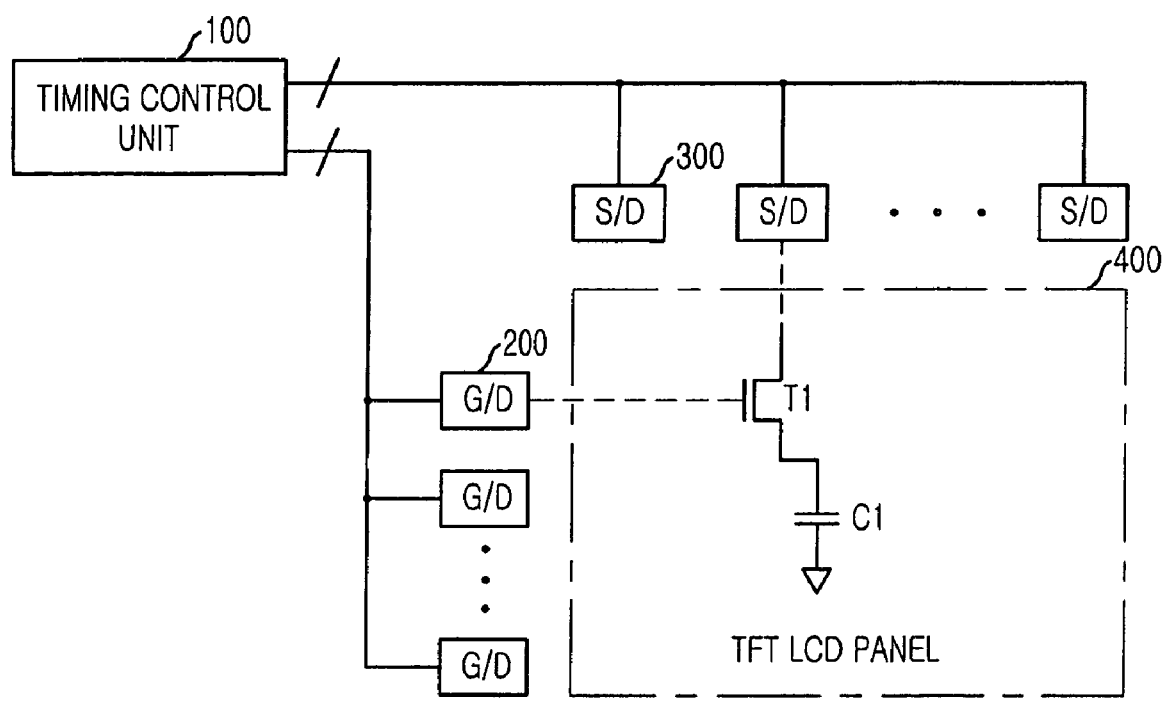
FIG. 1 is a block diagram showing a conventional thin film transistor LCD (TFT-LCD)
Figure 2:
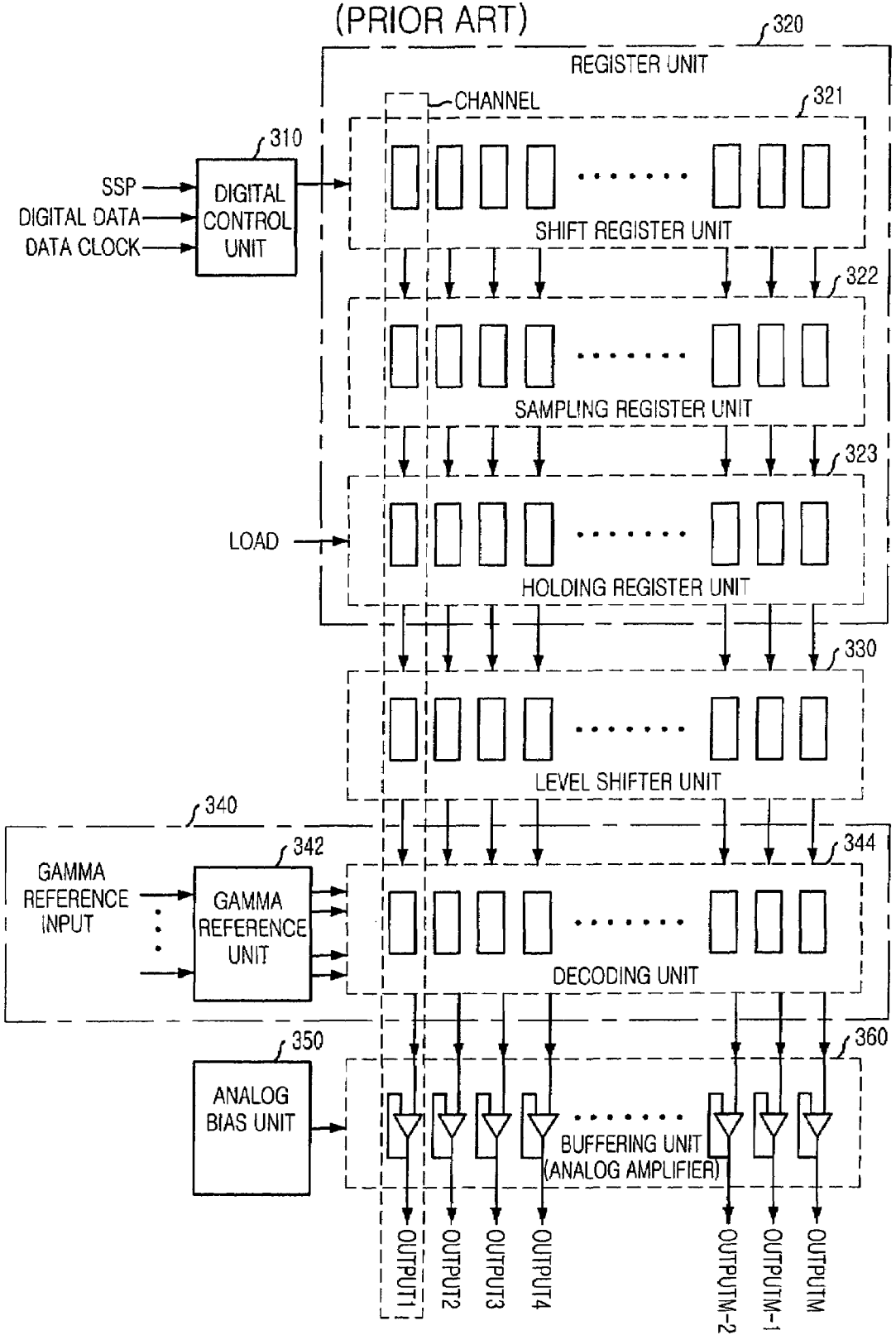
FIG. 2 is a block diagram depicting a source driver shown in FIG. 1.
Figure 3:
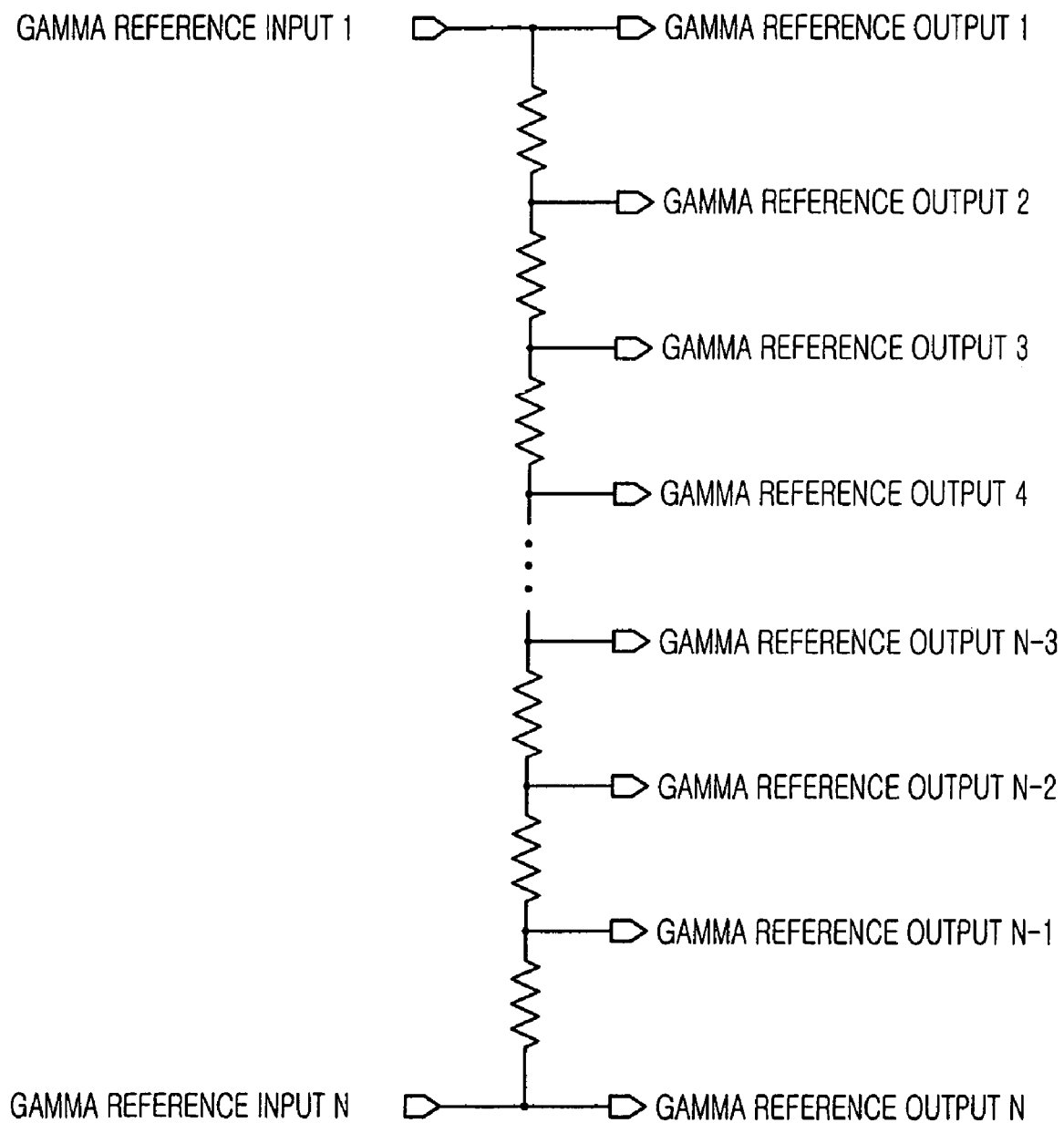
FIGS. 3 and 4 are schematic circuit diagrams respectively showing a gamma reference unit and a decoding unit shown in FIG. 2.
Figure 4:
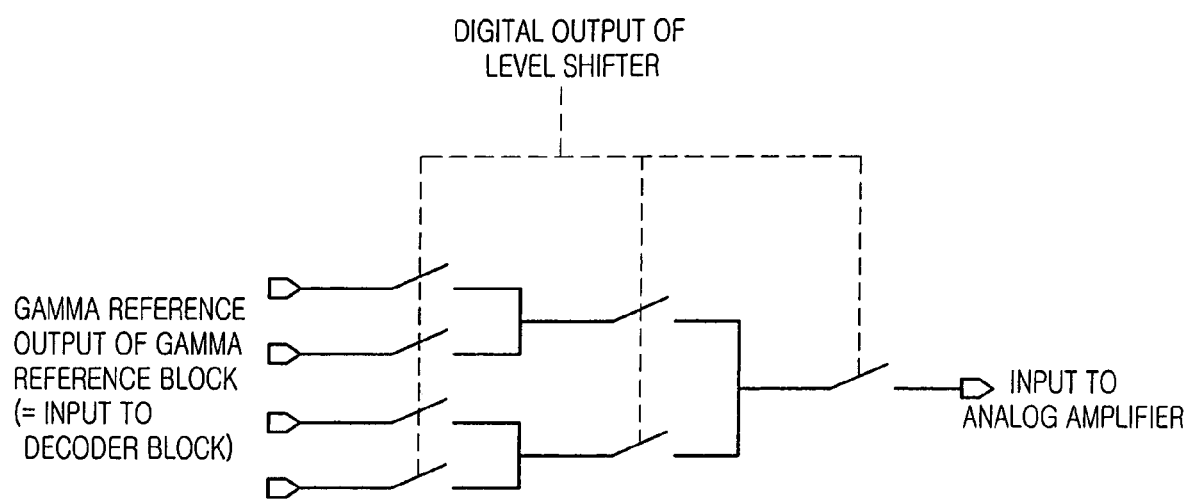
Figure 5:
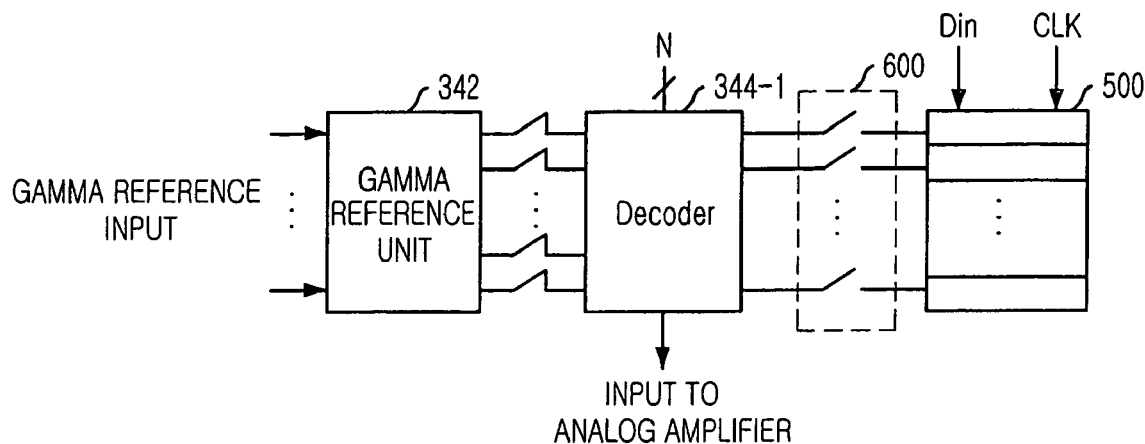
FIG. 5 is a block diagram showing a core circuit for testing a digital to analog converter in accordance with a preferred embodiment of the present invention.

FIG. 5 is a block diagram showing a core circuit for testing a digital to analog converter (DAC) included in an LDI in accordance with a preferred embodiment of the present invention.

As shown, the core circuit includes a gamma reference unit 342; a decoder 344-1; a shift register 500 for providing digital data instead of the gamma reference unit 342; and a switching unit 600 for selectively connecting the decoder 344-1 to the shift register 500.

When the LDI is operated in a normal mode, the gamma reference unit 342 supplies an analog voltage to the decoder 344-1 and the switching unit 600 disconnects the decoder 344-1 from the shift register 500. At this time, the decoder 344-1 selects one of a plurality of analog signals outputted from the gamma reference unit 342 according to a digital code signal generated by a level shifter. Then, the selected analog signal is inputted to an analog amplifier. Herein, the gamma reference unit 342 includes a series of resistors for generating the plurality of analog signals.

Figure 6:
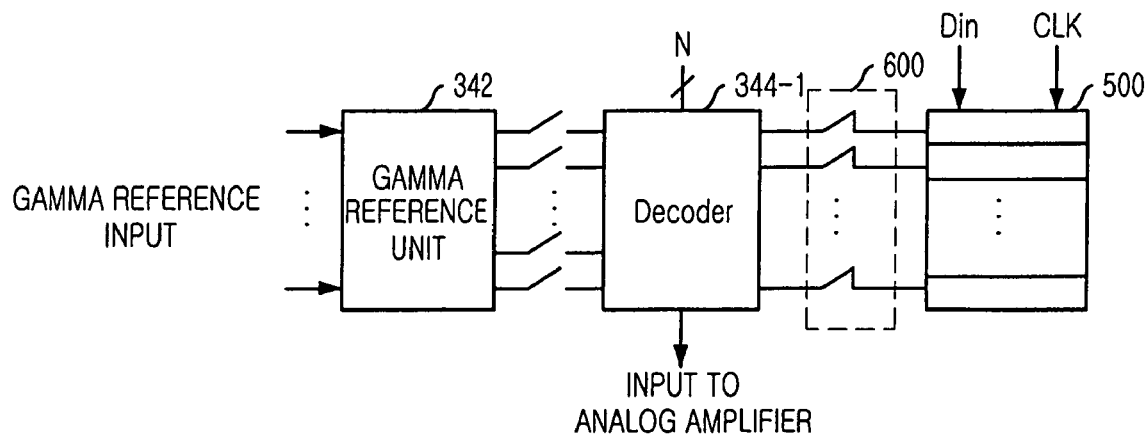
FIG. 6 is a block diagram showing the core circuit shown in FIG. 5 in a test mode.

FIG. 6 is a block diagram showing the core circuit when the LDI is operated in a test mode.

As shown, when the LDI is operated in the test mode, the gamma reference unit 342 is disconnected from the decoder 344-1 and the switching unit 600 connects the decoder unit 344-1 to the shift register 500.

Herein, the decoder 344-1 selects one of a plurality of digital signals outputted from the shift register 500 according to the digital code signal generated by the level shifter. Then, the selected digital signal is inputted to the analog amplifier. Thereafter, it is determined whether the decoder 344-1 is defective or not by measuring a voltage level of an output of the analog amplifier. For instance, when the decoder 344-1 is not defective, the output of the analog amplifier has a voltage level of about 0V or about 5V. However, when the decoder 344-1 is defective, the output of the analog amplifier has an indefinite voltage level between 0V and 5V.

That is, the decoder 344-1 is defective when, e.g., a switching element included in the decoder 344-1 is shorted. Due to the shorted switching element, the output of the analog amplifier has an indefinite voltage level between 0V and 5V.

In addition, it is preferable to test each decoder of each channel simultaneously for reducing a test time.

Meanwhile, in accordance with the preferred embodiment, the test can be performed by shifting a logic high signal in the shift register 500 by proving a clock signal to the shift register 500.

In accordance with another embodiment of the present invention, a general register can be adopted instead of the shift register. In this case, the test can be performed by inputting different logic signals to the decoder 344-1 by using an external input terminal instead of the clock signal. In accordance with a further embodiment of the present invention, a storage circuit such as a latch or a static random access memory (SRAM) can be adopted. Likewise, in this case, the test can be performed by inputting different logic signals to the decoder 344-1 by using an external input terminal instead of the clock signal.

Therefore, in accordance with the present invention, a test time for testing the LDI can be reduced and a test cost can be also decreased.

The present application contains subject matter related to Korean patent application No. 2004-61573, filed in the Korean Patent Office on Aug. 5, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A test device for testing a digital to analog converter, comprising:

a gamma reference unit for generating a plurality of analog signals different from each other;

a temporary storing unit for generating a plurality of digital signals different from each other;

a decoder for selecting one of the plurality of analog signals or one of the plurality of digital signals in response to a digital code signal; and a switching unit for controlling a connection between the decoder and the gamma reference unit and between the decoder and the temporary storing unit according to an operation mode.

2. The test device as recited in claim 1, wherein, at a normal mode, the decoder is connected to the gamma reference unit and is disconnected-from the temporary storing unit and, at a test mode, the decoder is disconnected from the gamma reference unit and is connected to the temporary storing unit.

3. The test device as recited in claim 2, wherein it is determined whether the digital to analog converter is defective by measuring a voltage level of an output of an analog amplifier, wherein the analog amplifier receives an output of the decoder.

4. The test device as recited in claim 1, wherein the temporary storing unit is a shift register.

5. The test device as recited in claim 1, wherein the temporary storing unit is a register.

6. The test device as recited in claim 1, wherein the temporary storing unit is a latch.

7. The test device as recited in claim 1, wherein the temporary storing unit is a static random access memory (SRAM).

8. The test device as recited in claim 1, wherein the gamma reference unit includes a series of resistors.

* * * * *

UNITED STATES PATENT AND TRADEMARK OFFICE
CERTIFICATE OF CORRECTION

| | | |
|---|---|---|
| PATENT NO. | : 7,167,117 B2 | |
| APPLICATION NO. | : 11/198597 | |
| DATED | : January 23, 2007 | |
| INVENTOR(S) | : Seong-Min Choe | |

It is certified that error appears in the above-identified patent and that said Letters Patent is hereby corrected as shown below:

Title page in Item [73], under Assignee, please delete "Inc." and insert --Ltd.--.

Signed and Sealed this
Twenty-first Day of February, 2012

David J. Kappos
*Director of the United States Patent and Trademark Office*